US008766685B1

(12) United States Patent
Zhao et al.

(10) Patent No.: US 8,766,685 B1
(45) Date of Patent: Jul. 1, 2014

(54) PHASE LOCKED LOOP CIRCUIT AND A METHOD IN THE PHASE LOCKED LOOP CIRCUIT

(71) Applicant: Beken Corporation, Shanghai (CN)

(72) Inventors: Yunfeng Zhao, Shanghai (CN); Ronghui Kong, Shanghai (CN); Dawei Guo, Shanghai (CN)

(73) Assignee: Beken Corporation, Shanghai (CN)

( * ) Notice: Subject to any disclaimer, the term of this patent is extended or adjusted under 35 U.S.C. 154(b) by 0 days.

(21) Appl. No.: 13/911,099

(22) Filed: Jun. 6, 2013

(30) Foreign Application Priority Data

May 8, 2013 (CN) .......................... 2013 1 0170137

(51) Int. Cl.
*H03L 7/06* (2006.01)
*H03L 7/08* (2006.01)
(52) U.S. Cl.
CPC ..................................... *H03L 7/08* (2013.01)
USPC ............ 327/157; 327/156; 327/146; 327/148
(58) Field of Classification Search
USPC .............. 327/141, 144–163; 331/1/A, 15–17; 375/373–376
See application file for complete search history.

(56) References Cited

U.S. PATENT DOCUMENTS

| 6,172,540 | B1 * | 1/2001 | Gandhi .......................... 327/145 |
| 6,281,758 | B1 * | 8/2001 | Elsayed et al. ................... 331/16 |
| 6,529,084 | B1 * | 3/2003 | Boerstler et al. ................ 331/57 |
| 7,532,077 | B2 * | 5/2009 | Wang et al. ..................... 331/1 A |
| 7,860,205 | B1 * | 12/2010 | Aweya et al. .................. 375/376 |
| 8,115,525 | B2 * | 2/2012 | Min et al. ....................... 327/156 |
| 8,193,842 | B2 * | 6/2012 | Min et al. ....................... 327/156 |
| 2005/0231244 | A1 * | 10/2005 | Hartfiel et al. ................. 327/141 |
| 2008/0278243 | A1 * | 11/2008 | Wang et al. ...................... 331/16 |

\* cited by examiner

*Primary Examiner* — Brandon S Cole
(74) *Attorney, Agent, or Firm* — Perkins Coie LLP; Aaron Wininger

(57) ABSTRACT

A PLL circuit comprises a phase frequency detector (PFD), a charge pump (CP), a low pass filter (LPF), a voltage controlled oscillator (VCO), a frequency divider (FD) and a reset module. The PFD receives a first and a second input signals, and outputs a first and a second adjustment parameters according to phase and frequency difference between the first and the second input signal. The CP is coupled to the PFD, generates a current according to the first and the second adjustment parameters. The LPF is coupled to the CP, and generates a voltage according to the current. The VCO is coupled to the LPF, and generates an oscillation frequency according to the voltage. The FD receives and divides the oscillation frequency, and generates the second input signal. The reset module generates a reset signal to feed to the FD, wherein the reset module receives the first signal.

16 Claims, 11 Drawing Sheets

PHASE LOCKED LOOP CIRCUIT AND A METHOD IN THE PHASE LOCKED LOOP CIRCUIT

CLAIM OF PRIORITY

This application claims priority to Chinese Application No. 201310170137.7 entitled "A PHASE LOCKED LOOP CIRCUIT AND A METHOD IN THE PHASE LOCKED LOOP CIRCUIT", filed on May 8, 2013 by Beken Corporation, which is incorporated herein by reference.

TECHNICAL FIELD

The present application relates to electrostatic circuits, and more particularly but not exclusive to a phase locked loop circuit and a method in the phase locked loop circuit.

BACKGROUND

A phase locked loop or phase-locked loop (PLL) is a control system that generates an output signal, also called a F_N clock, whose phase is related to the phase of an input "reference" signal, also called a F_ref clock.

After a PLL is powered on, the F_ref clock has initial phase error with the F_N clock, which ranges from 0 to $2\pi$. The PLL can only start a locking operation after the phase error has been cancelled.

SUMMARY OF THE INVENTION

In an embodiment, there is provided a phase locked loop (PLL) circuit, A PLL circuit comprises a phase frequency detector (PFD), a charge pump (CP), a low pass filter (LPF), a voltage controlled oscillator (VCO), a frequency divider (FD) and a reset module. The PFD receives a first and a second input signals, and outputs a first and a second adjustment parameters according to phase and frequency difference between the first and the second input signal. The CP is coupled to the PFD, generates a current according to the first and the second adjustment parameters. The LPF is coupled to the CP, and generates a voltage according to the current. The VCO is coupled to the LPF, and generates an oscillation frequency according to the voltage. The FD receives and divides the oscillation frequency, and generates the second input signal. The reset module generates a reset signal to feed to the FD, wherein the reset module receives the first signal.

In another embodiment, there is provided a method in a phase locked loop (PLL) circuit, comprising: receiving, by a phase frequency detector, a first input signal and a second input signal, and to output a first adjustment parameter and a second adjustment parameter according to phase and frequency difference between the first input signal and the second input signal; generating, by a charge pump, a current according to the first adjustment parameter and the second adjustment parameters; generating, by a low pass filter, a voltage according to the current; generating, by a voltage controlled oscillator (VCO), an oscillation frequency according to the voltage; receiving the oscillation frequency, dividing the oscillation frequency, generating the second input signal using the divided oscillation frequency, by a frequency divider; and generating, by a reset module, a reset signal to feed to the frequency divider.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION OF THE ILLUSTRATED EMBODIMENTS

Various aspects and examples of the invention will now be described. The following description provides specific details for a thorough understanding and enabling description of these examples. Those skilled in the art will understand, however, that the invention may be practiced without many of these details. Additionally, some well-known structures or functions may not be shown or described in detail, so as to avoid unnecessarily obscuring the relevant description.

Figure 1:
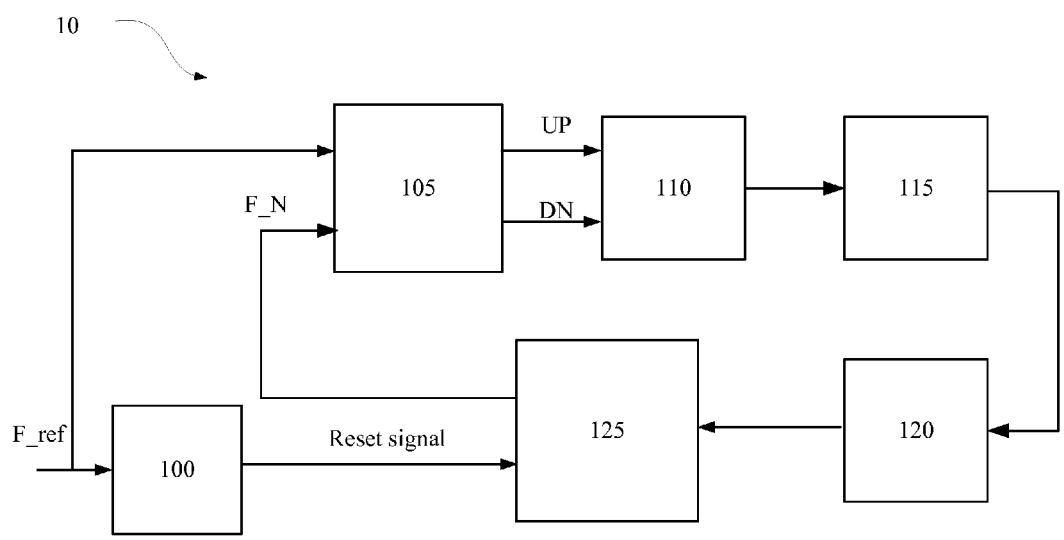
FIG. 1 shows a schematic diagram of a phase locked loop according to an embodiment of the invention.

FIG. 1 shows a schematic diagram of a phase locked loop according to an embodiment of the invention.

As shown in FIG. 1, the phase locked loop (PLL) circuit 10 comprises a reset module (100), a phase frequency detector (PFD) 105, a charge pump (CP) 110, a low pass filter (LPF) 115, a voltage controlled oscillator (VCO) 120, and a frequency divider (FD) 125.

The phase frequency detector 105 is configured to receive a first input signal F_ref and a second input signal F_N, and to output a first adjustment parameter, as marked as UP (up) in FIG. 1, and a second adjustment parameter, as marked as DN (down) in FIG. 1, according to a phase and frequency difference between the first input signal F_ref and the second input signal F_N. The first input signal comprises the F_ref clock signal (marked as F_ref in FIG. 1), and the second input signal comprises the F_N clock signal (marked as F_N in FIG. 1). The difference between the first adjustment parameter UP and the second adjustment parameter DN is proportional to the phase and frequency difference between the first input signal F_ref and the second input signal F_N.

The charge pump 110 is coupled to the phase frequency detector 105, and is configured to generate a current according to the first adjustment parameter UP and the second adjustment parameter DN.

The low pass filter 115 is coupled to the charge pump 110. The low pass filter 115 is configured to generate a voltage according to the current.

The voltage controlled oscillator 120 is coupled to the low pass filter 115. The voltage controlled oscillator 120 is configured to generate an oscillation frequency according to the voltage. The voltage controlled oscillator 120 may comprise a LC oscillator.

The frequency divider 125 is configured to receive the oscillation frequency, to divide the oscillation frequency by N, and to generate the second input signal F_N using the divided oscillation frequency, therefore the second input signal F_N equals the output frequency of the voltage controlled oscillator 120 divided by N.

Figure 2:
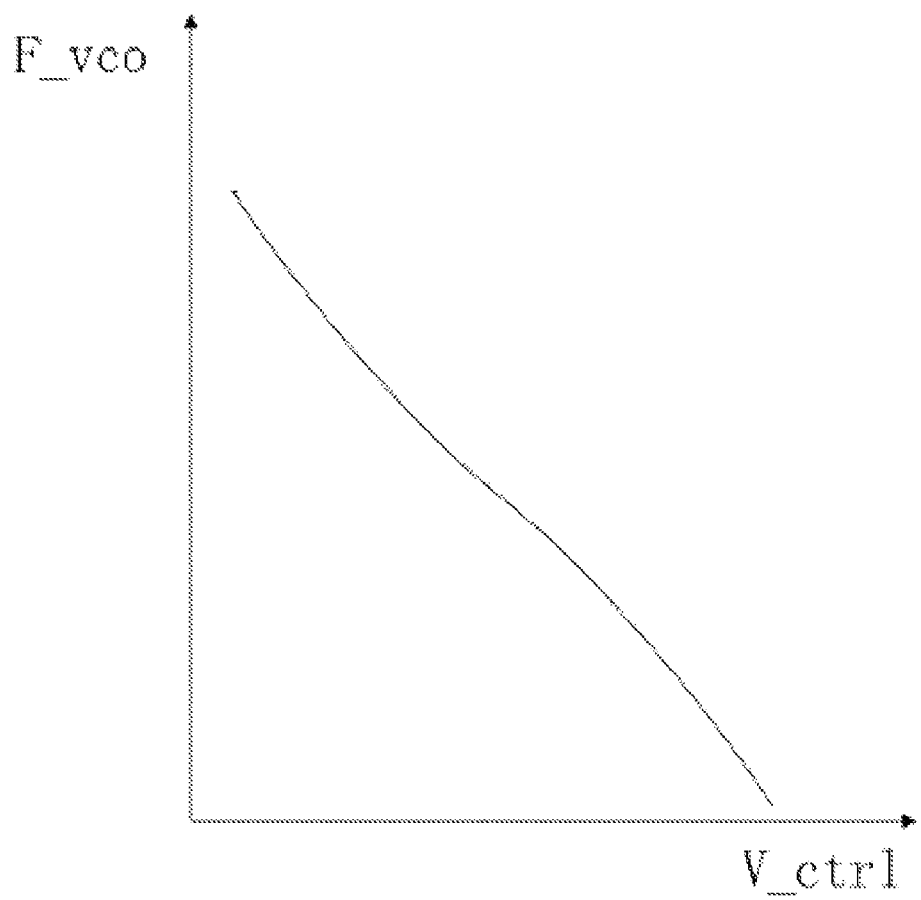
FIG. 2 shows a relationship between the control voltage inputted into the voltage controlled oscillator and the output frequency F_vco of the voltage controlled oscillator.
Figure 3A:
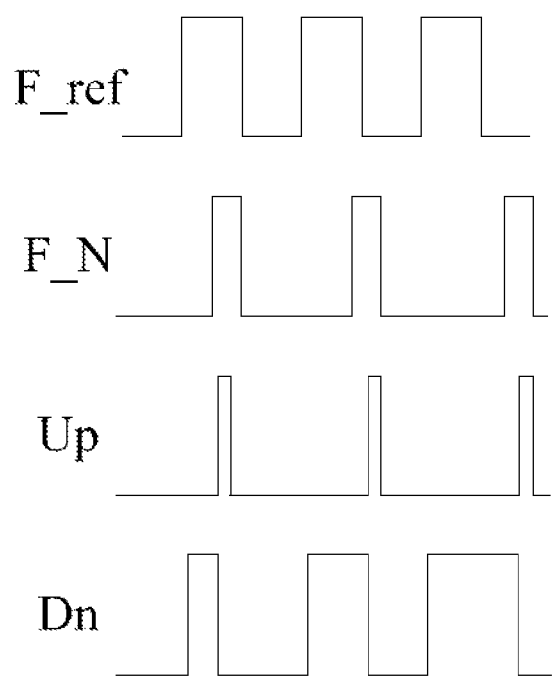
FIG. 3A illustrates a scenario in which the phase of second input signal F_N falls behind that of the first input signal F_ref.
Figure 3B:
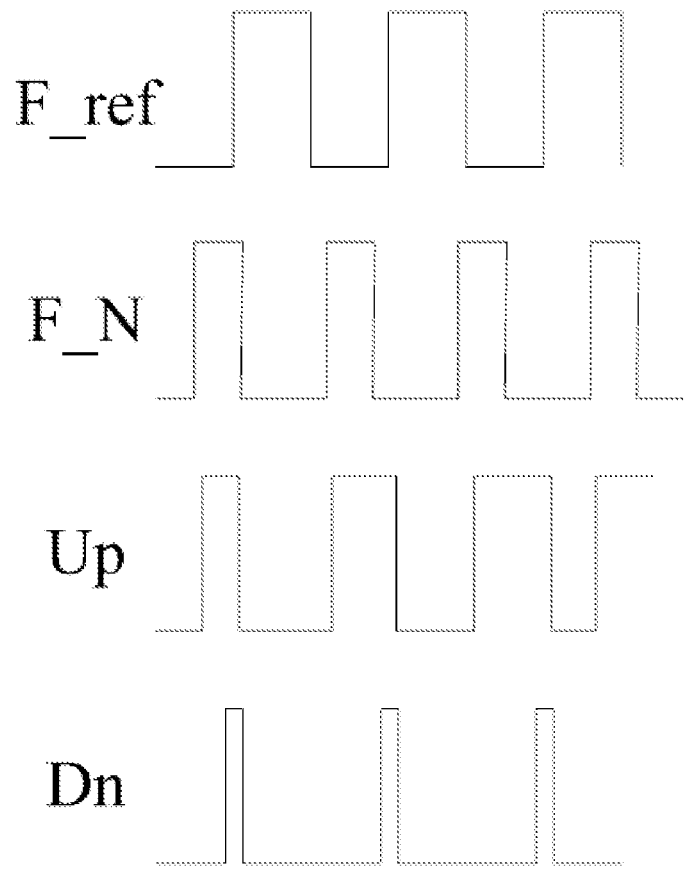
FIG. 3B illustrates a scenario in the phase of the second input signal F_N creeps ahead of that of the first input signal F_ref.

The PLL circuit 10 uses a negative feedback loop. Assume that initially the second input signal F_N is at nearly the same frequency as the first input signal F_ref. Further assume that the output frequency of voltage controlled oscillator 120 is inversely proportional to the voltage inputted into the voltage controlled oscillator 120, as illustrated in FIG. 2. If the phase of second input signal F_N falls behind that of the first input signal F_ref, as illustrated in FIG. 3A, the phase frequency detector 105 changes the control voltage of the voltage controlled oscillator 120, for example outputs the first adjustment parameter UP with a pulse bandwidth smaller than the second adjustment parameter DN, so that the voltage controlled oscillator 120 speeds up and the second input signal F_N speeds up accordingly, and the second input signal F_N approaches the first input signal F_ref. Likewise, if the phase of the second input signal F_N creeps ahead of that of the first input signal F_ref, as illustrated in FIG. 3B, the phase detector 105 changes the control voltage to the voltage controlled oscillator 120, for example outputs the first adjustment parameter UP with a pulse bandwidth larger than the second adjustment parameter DN, so that the second input signal F_N slows down accordingly, and the second input signal F_N approaches the first input signal F_ref.

The reset module 100 is configured to generate a reset signal to feed to the frequency divider 125, wherein the reset module 100 is configured to receive the first signal F_ref.

More detailed discussion of the reset module 100 will be given below with reference to FIGS. 4, 4A and 4B.

Figure 4:
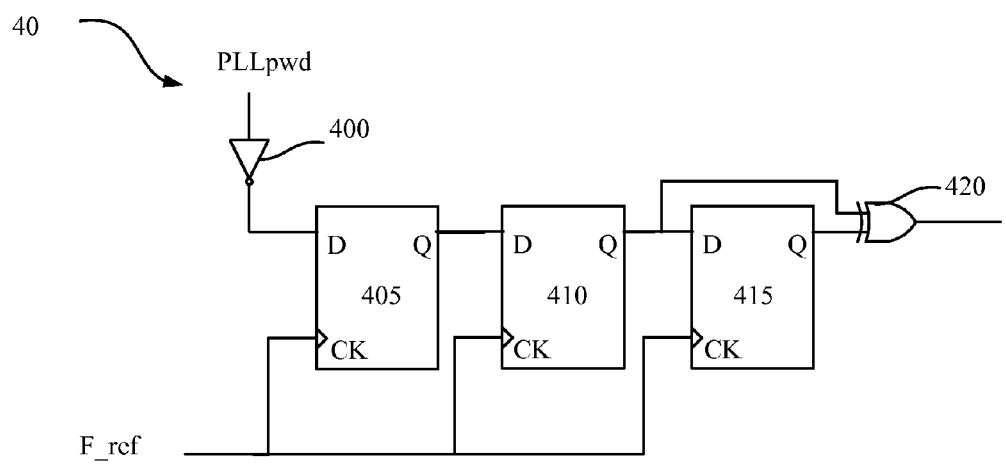
FIG. 4 shows a circuit diagram of the reset module according to an embodiment of the invention.

FIG. 4 shows a circuit diagram of the reset module according to an embodiment of the invention.

In FIG. 4, the reset module 40 comprises a first inverter 400, a first D-type flip flop 405, a second D-type flip flop 410, a third D-type flip flop 415, and an Exclusive-OR(XOR) gate 420. The first inverter 400 receives a third signal PLLpwd (PLL power down). A D port of the first D-type flip flop 405 is connected to an output port of the first inverter 400, and a Q port of the first D-type flip flop 405 is connected to a D port of the second D-type flip flop 410. A Q port of the second D-type flip flop 410 is connected to both a first input port of the XOR gate 420 and a D port of the third D-type flip flop 415. A Q port of the third D-type flip flop 415 is connected to a second input port of the XOR gate 420. Clock ports of the first, second and third D-type flip flops 405,410 and 415 all receive the first input signal F_ref, such that the XOR gate 420 outputs a reset pulse.

Those skilled in the art can appreciate that the two input ports of XOR gate 420 respectively receive the output from the second D-type flip flop 410 and the third D-type flip flop 415. The XOR gate 420 outputs "1" when the output of the second D-type flip flop 410 is "1" and the output of the third D-type flip flop 415 is "0", or when the output of the second D-type flip flop 410 is "0" and the output of the third D-type flip flop 415 is "1". The XOR gate 420 outputs "0" when the output of the second D-type flip flop 410 and the output of the third D-type flip flop 415 are the same. Since the output of the third D-type flip flop 415 is a delayed version of the second D-type flip flop 410, that is to say, a pulse is generated during the time when the first D-type flip flop 410 is "1" and the output of the second D-type flip flop 415 is "0". Therefore, the duration of the pulse generated by the XOR gate 420 is the same as delay time for a D-type flip flop. Here, "0" represents logic low voltage, for example, ground, and "1" represents high voltage, for example Vcc.

Figure 4A:
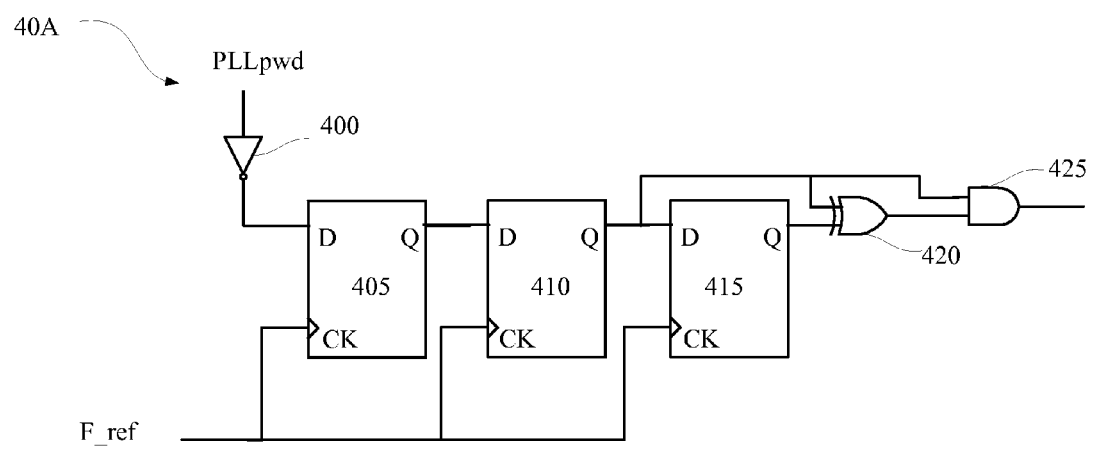
FIG. 4A shows the reset module 40A according to another embodiment of the present invention.

FIG. 4A shows another embodiment of the reset module 40A. In FIG. 4A, same reference numbers refer to the same circuit elements as in FIG. 4. In FIG. 4A, the reset module 40A further comprises an AND gate 425. A first input port of the AND gate 425 is connected to both the Q port of the second D-type flip flop 410 and the first input port of the XOR gate 420, a second input port of the AND gate 425 is connected to the output port of the XOR gate 420, and the AND gate 425 outputs the reset signal.

Figure 4B:
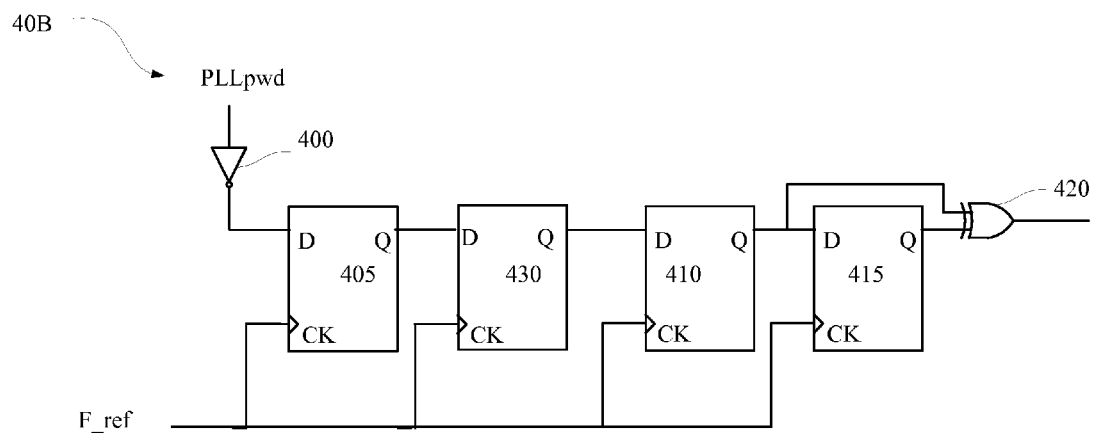
FIG. 4B shows the reset module 40B according to another embodiment of the present invention.

FIG. 4B shows another embodiment of the reset module 40B. In FIG. 4B, same reference numbers refer to the same circuit elements as in FIG. 4. In FIG. 4B, the reset module 40B further comprises at least one fourth D-type flip flop 430 serially connected between the Q port of the first D-type flip flop 405 and the D port of the second D-type flip flop 410. FIG. 4B shows one fourth D-type flip flop 430 between the first D-type flip flop 405 and the second D-type flip flop 410. Those skilled in the art can appreciate that a plurality of additional D-type flip flops can be arranged serially between the first D-type flip flop 405 and the second D-type flip flop 410.

Figure 5:
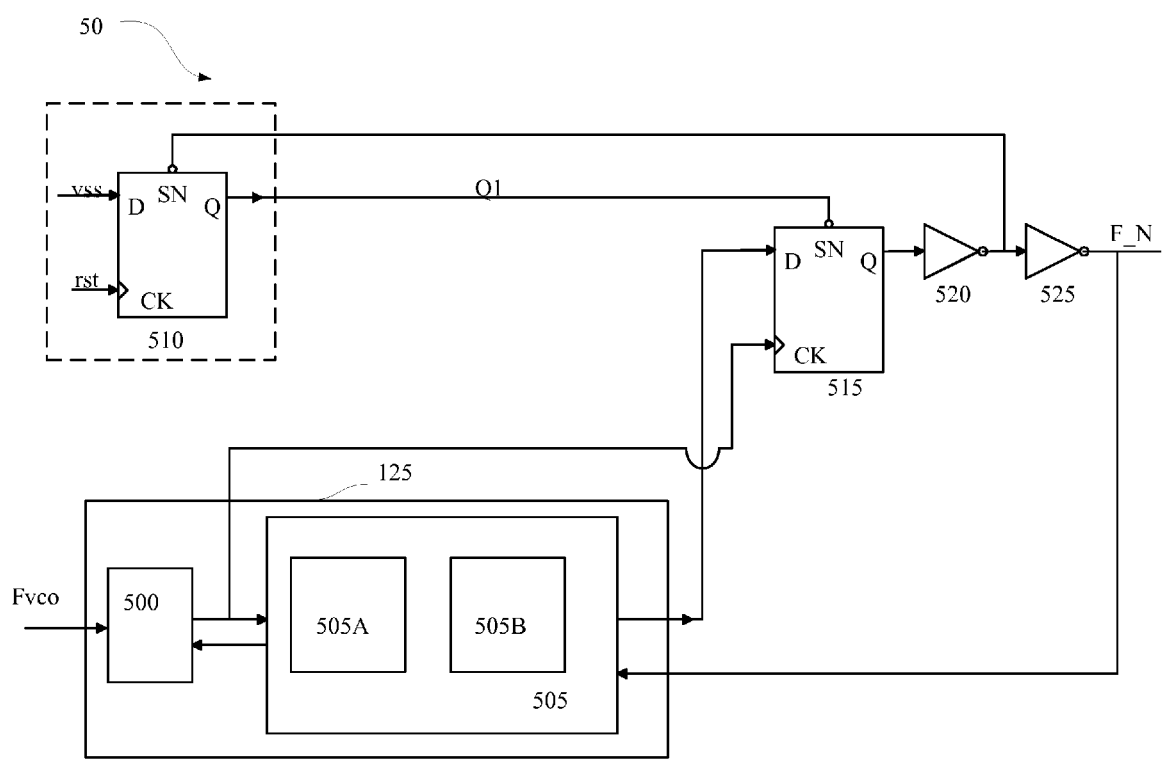
FIG. 5 shows a block diagram of part of the phase locked loop 50 according to an embodiment of the present invention.

FIG. 5 shows a block diagram of part of the phase locked loop 50, showing the connection relationship among the frequency divider, the reset signal and the voltage control oscillator.

As shown in FIG. 5, the frequency divider 125 further comprises a 2-module prescaler 500 and a counter module 505. The counter module 505 further comprises a counter A 505A and a counter B 505B. The phase locked loop circuit 50 further comprises a fifth D-type flip flop 510, a sixth D-type flip flop 515, a second inverter 520 and a third inverter 525.

The 2-module prescaler 500 is connected to a first input port of the counter module 505. The 2-module prescaler 500 is configured to divide the frequency of an input signal in the frequency division ratio of 1/K or 1/(K+1) according to the contents of a control signal supplied to the control terminal of the 2-module prescaler 500. In other words, the frequency Fvco of a signal delivered from the voltage controlled oscillator 120 is divided by the prescaler 505 in the ratio corresponding to the contents of a control signal. Where, in this case, the control terminal of the prescaler 500 is supplied with a high level signal, then the prescaler divides the frequency of an input signal in the ratio of 1/(K+1), for example 1/9. Where the control terminal of the presccaler 500 receives a low level signal, then the prescaler 500 divides the frequency of an input signal in the ratio of 1/K, for example, 1/8. Alternatively, the 2-module prescaler comprises a 4/5 divider, or the 2-module prescaler comprises a 2/3 divider.

The counter 505 is used to control the prescaler 500. The counter 505 comprises a counter A 505A and a counter B 505B. Counter A is able to divide input frequency by a predetermined number A, and counter B is able to divide input frequency by a predetermined number B. The output frequency of the signal of the frequency divider 125 equals $$F = \frac{Fvco}{AK+B}.$$

For example, the input Fvco equals 2.4 GHz, the prescaler has a K which equals 8. A equals 300, and B equals 0. Therefore the output frequency equals 1 MHz.

A clock port of a fifth D-type flip flop 510 receives the reset signal (rst). A D port of the fifth D-type flip flop 510 is configured to receive a negative supply voltage (Vss). A Q port of the fifth D-type flip flop 510 is connected to a negative set port (SN) of a sixth D-type flip flop 515. A Q port of the sixth D-type flip flop 515 is connected to an input port of the second inverter 520. An output port of the second inverter 520 is connected to both the third inverter 525 and a negative set port (SN) of the fifth D-type flip flop 510. The third inverter 525 is connected to a second input port of the counter module 505. A first output port of the counter module 505 is connected to a D port of the sixth D-type flip flop 515. A second output port of the counter module 505 is fed back to the 2-module prescaler 500. The 2-module prescaler 500 is further connected to a clock port of the sixth D-type flip flop 515.

When the negative set port (SN) of the fifth D-type flip flop 510 is set to "0", it means that whatever the value of D port of the fifth D-type flip flop 510 is, Q port of the fifth D-type flip flop 510 always outputs "1". When negative set port (SN) of the fifth D-type flip flop 510 is set to "1", then the fifth D-type flip flop 510 captures the value of the D port of the fifth D-type flip flop 510 at a definite portion of the clock cycle (such as the rising edge of the clock), and the captured value becomes the Q output of the fifth D-type flip flop 510.

Figure 6:
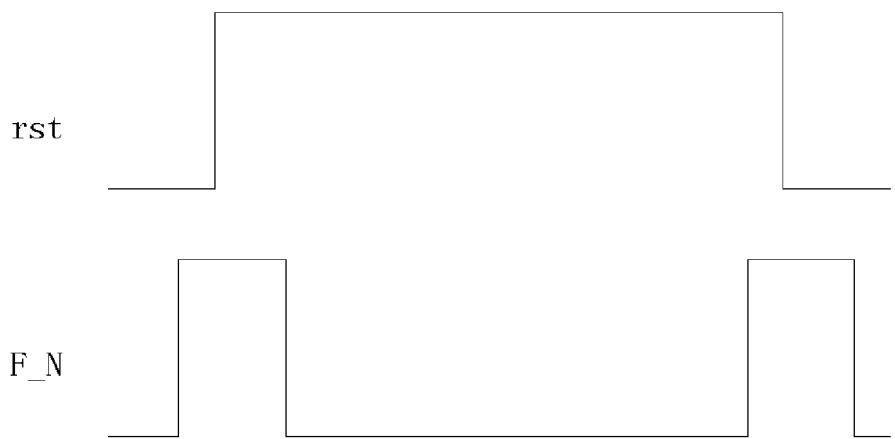
FIG. 6 shows a sketch illustrating order of the reset signal and the second input signal F_N according to an embodiment of the present invention.

FIG. 6 shows a sketch illustrating order of the reset signal and the second input signal F_N according to an embodiment of the present invention.

Note that since the reset signal is generated from the first input signal F_ref, the high voltage of the reset signal always align with the first input signal F_ref. If the reset signal is generated at the time when the second input signal F_N is at high "1", as shown in FIG. 6, then the negative set port (SN) of fifth D-type flip flop 510 is "0", which means the reset signal does not work, and the circuit will not be reset. The duty cycle of the signal F_N is small. The width of high level voltage of F_N is 8/Fvco, for example. If Fvco equals 2400 MHz, then the width of high level voltage of F_N is 3.33 ns. F_ref=1M. Therefore, the maximum phase error between the first input signal F_N and the second input signal F_ref is $$\frac{3.33}{1000} \times 2\pi.$$

If the initial frequency of VCO is Fvco+ΔF, or Fvco−ΔF, wherein Fvco represents the locked frequency, and Fvco=N×Fref, then the frequency of F_N is $$\frac{N \times Fref + \Delta F}{N} \text{ or } \cdot \frac{N \times Fref - \Delta F}{N}$$

When the initial frequency of VCO equals Fvco+ΔF, in order to compensate a 2π phase duration, there are k F_N periods and k−1 F_ref periods, that is $$\frac{N}{N \times Fref + \Delta F} \times k = \frac{1}{Fref} \times (k-1)$$

Therefore, $$k = \frac{N \times Fref + \Delta F}{\Delta F}.$$

In order to compensate a 2π phase error, the following time is needed:

$$k \times \frac{N}{N \times Fref + \Delta F} = \frac{N}{\Delta F}$$

When the initial frequency of VCO is Fvco−ΔF, in order to compensate a 2π phase duration, there are k−1 F_N period and k F_ref period, that is $$\frac{N}{N \times Fref - \Delta F} \times (k-1) = \frac{1}{Fref} \times k$$

Therefore, $$k = \frac{N \times Fref}{\Delta F}.$$

In order to compensate a 2π phase error, the following time is needed:

$$k \times \frac{1}{Fref} = \frac{N}{\Delta F}$$

Therefore, the time needed for compensating a 2π phase error equals $$\frac{N}{\Delta F}.$$

Suppose N=2400, F_ref=1M, Fvco=2400M, ΔF=30M, time needed to cancel 2π phase error is 80 μs.

In order to cancel the maximum phase error, $$\frac{3.33}{1000} \times 2\pi,$$

between the first input signal F_N and the second input signal F_ref, a time of $$\frac{3.33}{1000} \times 80 \text{ μs} = 0.266 \text{ μs}$$

is needed.

Figure 7:
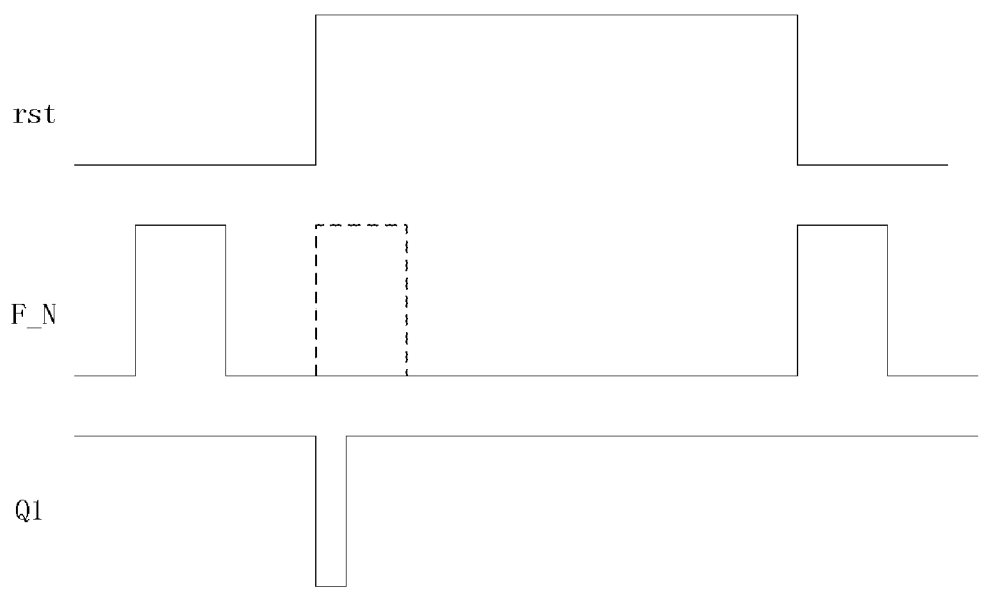
FIG. 7 shows a sketch illustrating order of the reset signal, the second input signal F_N and the Q output of the fifth D-type flip flop according to another embodiment of the present invention.

FIG. 7 shows a sketch illustrating order of the reset signal, second input signal F_N and Q output of the fifth D-type flip flop 510 Q1, according to another embodiment of the present invention.

If the reset signal is generated when the second input signal F_N is at low "0", as shown in FIG. 7, then the negative set port (SN) of fifth D-type flip flop 510 is "1", which means the reset signal works. The Q port (Q1) of the fifth D-type flip flop 510 outputs a low voltage, which will set the second input signal F_N to a high voltage, and the high voltage of F_N will set the SN of the fifth D-type flip flop, that is the high voltage of F_N feed a "0" to the SN of the fifth D-type flip flop, so that the SN of the fifth D-type flip flop is set to "0". When the SN of the fifth D-type flip flop is set to "0", the Q port (Q1) of the fifth D-type flip flop 510 is set to "1". Therefore, a narrow low voltage pulse occurs in the signal output by the Q port (Q1) of the fifth D-type flip flop. The second input signal F_N will reset the counter 505, and trigger the counter 505 to restart countering, therefore the frequency divider 505 resume the denominator of AK+B. In this situation, the phase difference between the first input signal F_ref and the second input signal F_N equals the delay of gate, which can be neglected.

Figure 8:
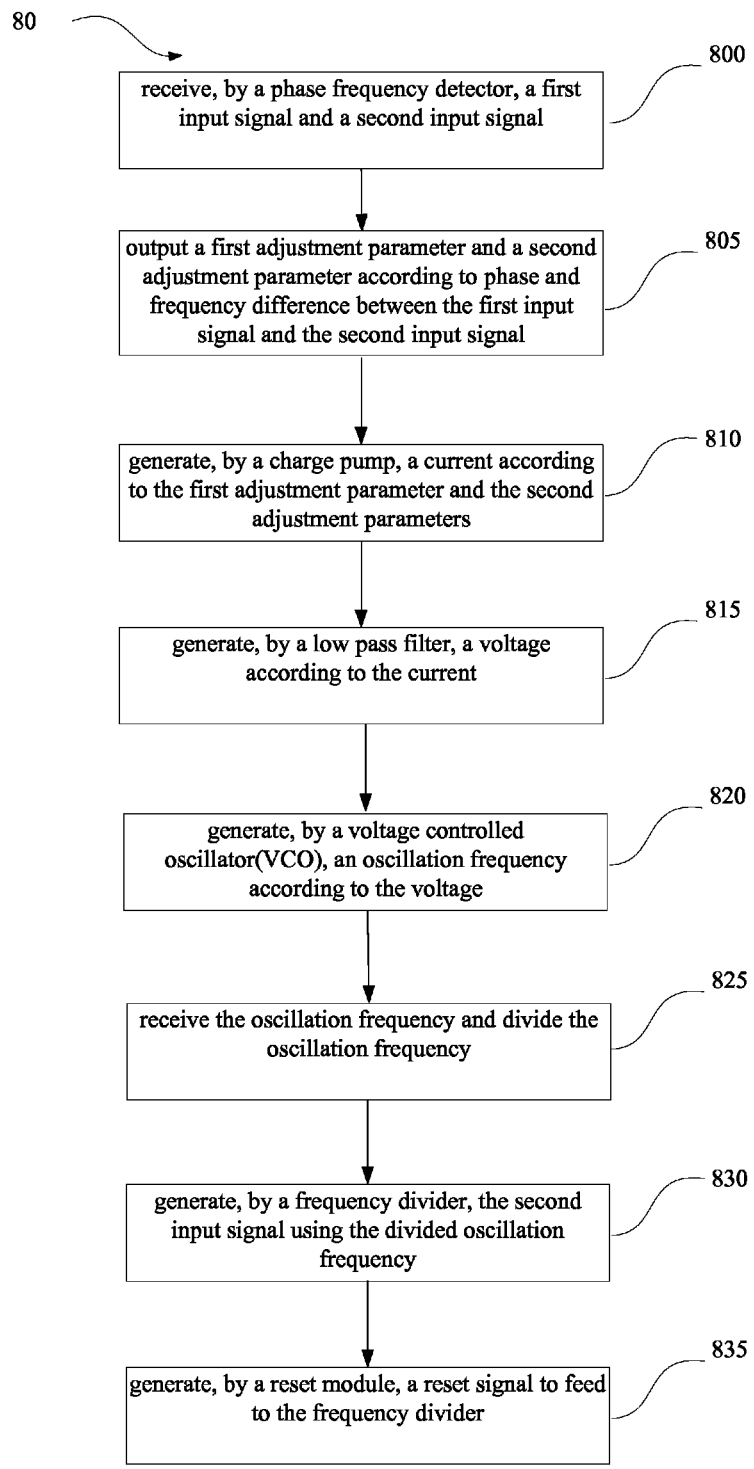
FIG. 8 shows a flow chart of a method in the phase locked loop according to an embodiment of the present invention.

FIG. 8 shows a method in a phase locked loop (PLL) circuit according to an embodiment of the present invention. The method 80 comprises receiving (800), by a phase frequency detector, a first input signal and a second input signal. The method 80 further comprises outputting (805) a first adjustment parameter and a second adjustment parameter according to phase and frequency difference between the first input signal and the second input signal. The method 80 then generates (810), by a charge pump, a current according to the first adjustment parameter and the second adjustment parameters. The method 80 then generates (815), by a low pass filter, a voltage according to the current. The method then generates (820), by a voltage controlled oscillator (VCO), an oscillation frequency according to the voltage. The method 80 then receives (825) the oscillation frequency and divides the oscillation frequency. The method 80 then generates (830), by a frequency divider, the second input signal using the divided oscillation frequency. The method 80 then generates (835), by a reset module, a reset signal to feed to the frequency divider.

Alternatively, the first signal comprises a reference signal.

Alternatively, the third signal comprises a phase locked loop power down signal.

It should be appreciated by those skilled in the art that components from different embodiments may be combined to yield another technical solution. This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A phase locked loop (PLL) circuit, comprising:
a phase frequency detector, configured to receive a first input signal and a second input signal, and to output a first adjustment parameter and a second adjustment parameter according to phase and frequency difference between the first input signal and the second input signal;
a charge pump coupled to the phase frequency detector, configured to generate a current according to the first adjustment parameter and the second adjustment parameters;
a low pass filter coupled to the charge pump, configured to generate a voltage according to the current;
a voltage controlled oscillator (VCO) coupled to the low pass filter, configured to generate an oscillation frequency according to the voltage;
a frequency divider configured to receive the oscillation frequency, to divide the oscillation frequency, and to generate the second input signal using the divided oscillation frequency; and
a reset module configured to generate a reset signal to feed to the frequency divider, wherein the reset module is configured to receive the first signal; wherein the reset module comprises a first inverter, a first D-type flip flop, a second D-type flip flop, a third D-type flip flop, and an Exclusive-OR(XOR) gate, wherein
the first inverter is configured to receive a third signal, a D port of the first D-type flip flop is connected to the first inverter, and a Q port of the first D-type flip flop is connected to a D port of the second D-type flip flop, a Q port of the second D-type flip flop is connected to both a first input port of the XOR gate and a D port of the third D-type flip flop, a Q port of the third D-type flip flop is connected to a second input port of the XOR gate, clock ports of the first, second and third D-type flip flops are all configured to receive the first input signal, such that the XOR gate outputs a reset pulse.

2. The phase locked loop circuit of claim 1, wherein the reset module further comprises an AND gate, wherein a first input port of the AND gate is connected to both the Q port of the second D-type flip flop and the first input port of the XOR gate, a second input port of the AND gate is connected to the XOR gate, and the AND gate outputs the reset signal.

3. The phase locked loop circuit of claim 1, wherein the reset module further comprises at least one fourth D-type flip flop serially connected between the Q port of the first D-type flip flop and the D port of the second D-type flip flop.

4. The phase locked loop circuit of claim 1, wherein the third signal comprises a phase lock loop power down signal.

5. A phase locked loop (PLL) circuit, comprising:
a phase frequency detector, configured to receive a first input signal and a second input signal, and to output a first adjustment parameter and a second adjustment parameter according to phase and frequency difference between the first input signal and the second input signal;
a charge pump coupled to the phase frequency detector, configured to generate a current according to the first adjustment parameter and the second adjustment parameters;
a low pass filter coupled to the charge pump, configured to generate a voltage according to the current;
a voltage controlled oscillator (VCO) coupled to the low pass filter, configured to generate an oscillation frequency according to the voltage;
a frequency divider configured to receive the oscillation frequency, to divide the oscillation frequency, and to generate the second input signal using the divided oscillation frequency; and
a reset module configured to generate a reset signal to feed to the frequency divider, wherein the reset module is configured to receive the first signal;
wherein the frequency divider further comprises a 2-module prescaler, a counter module, the phase locked loop circuit further comprises a fifth D-type flip flop, a sixth D-type flip flop, a second inverter and a third inverter, wherein the 2-module prescaler is connected to a first input port of the counter module, the reset module is connected to a clock port of a fifth D-type flip flop, a D port of the fifth D-type flip flop is configured to receive a negative supply voltage (Vss), a Q port of the fifth D-type flip flop is connected to a negative set port (SN) of a sixth D-type flip flop, a Q port of the sixth D-type flip flop is connected to an input port of the second inverter, an output port of the second inverter is connected to both the third inverter and a negative set port (SN) of the fifth D-type flip flop, the third inverter is connected to a second input port of the counter module, a first output port of the counter module is connected to a D port of the sixth D-type flip flop, a second output port of the counter module is fed back to the 2-module prescaler, the 2-module prescaler is further connected to a clock port of the sixth D-type flip flop.

6. The phase locked loop circuit of claim 5, wherein the 2-module prescaler comprises a 8/9 divider.

7. The phase locked loop circuit of claim 5, wherein the 2-module prescaler comprises a 4/5 divider.

8. The phase locked loop circuit of claim 5, wherein the 2-module prescaler comprises a 2/3 divider.

9. The phase locked loop circuit of claim 5, wherein the counter module comprises a first counter and a second counter.

10. The phase locked loop circuit of claim 5, wherein the voltage controlled oscillator comprises a LC oscillator.

11. The phase locked loop circuit of claim 5, wherein the first signal comprises a reference signal.

12. The phase locked loop circuit of claim 1, wherein the voltage controlled oscillator comprises a LC oscillator.

13. The phase locked loop circuit of claim 1, wherein the first signal comprises a reference signal.

14. A method in a phase locked loop (PLL) circuit, comprising:

receiving, by a phase frequency detector, a first input signal and a second input signal;

outputting a first adjustment parameter and a second adjustment parameter according to phase and frequency difference between the first input signal and the second input signal;

generating, by a charge pump, a current according to the first adjustment parameter and the second adjustment parameters;

generating, by a low pass filter, a voltage according to the current;

generating, by a voltage controlled oscillator (VCO), an oscillation frequency according to the voltage;

receiving the oscillation frequency, dividing the oscillation frequency, generating the second input signal using the divided oscillation frequency, by a frequency divider; and generating, by a reset module, a reset signal to feed to the frequency divider; wherein the reset module comprises a first inverter, a first D-type flip flop, a second D-type flip flop, a third D-type flip flop, and an Exclusive-OR (XOR) gate, wherein the first inverter is configured to receive a third signal, a D port of the first D-type flip flop is connected to the first inverter, and a Q port of the first D-type flip flop is connected to a D port of the second D-type flip flop, a Q port of the second D-type flip flop is connected to both a first input port of the XOR gate and a D port of the third D-type flip flop, a Q port of the third D-type flip flop is connected to a second input port of the XOR gate, clock ports of the first, second and third D-type flip flops are all configured to receive the first input signal, such that the XOR gate outputs a reset pulse.

15. The method of claim 14, wherein the first signal comprises a reference signal.

16. The method of claim 14, wherein the third signal comprises a phase locked loop power down signal.

* * * * *